US010629668B1

United States Patent
Zhang et al.

(10) Patent No.: US 10,629,668 B1
(45) Date of Patent: Apr. 21, 2020

(54) DISPLAY PANEL AND DISPLAY DEVICE THEREOF

(71) Applicant: SHANGHAI TIANMA MICRO-ELECTRONICS CO., LTD., Shanghai (CN)

(72) Inventors: Guofeng Zhang, Wuhan (CN); Tianqing Hu, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/363,732

(22) Filed: Mar. 25, 2019

(30) Foreign Application Priority Data

Nov. 30, 2018 (CN) .......................... 2018 1 1451431

(51) Int. Cl.
*H01L 27/32* (2006.01)
*H01L 51/52* (2006.01)
*H01L 51/50* (2006.01)

(52) U.S. Cl.
CPC ...... *H01L 27/3272* (2013.01); *H01L 27/3246* (2013.01); *H01L 27/3262* (2013.01); *H01L 27/3265* (2013.01); *H01L 51/5012* (2013.01); *H01L 51/5253* (2013.01)

(58) Field of Classification Search
CPC ............. H01L 27/3272; H01L 51/5012; H01L 27/3265; H01L 51/5253; H01L 27/3246; H01L 27/3262
See application file for complete search history.

(56) References Cited

U.S. PATENT DOCUMENTS

| 2009/0021154 | A1* | 1/2009 | Aota | ................... H01L 27/3258 |
| | | | | 313/504 |
| 2016/0284770 | A1 | 9/2016 | Kim | |
| 2018/0075804 | A1* | 3/2018 | Kim | ..................... G09G 3/3233 |
| 2018/0366523 | A1* | 12/2018 | Yoshida | ............... G01J 1/0403 |
| 2019/0074344 | A1* | 3/2019 | Ka | ....................... H01L 27/3276 |
| 2019/0165076 | A1* | 5/2019 | Lee | ..................... H01L 27/3276 |
| 2020/0027943 | A1* | 1/2020 | Kim | ..................... H01L 51/5253 |

FOREIGN PATENT DOCUMENTS

| CN | 106158881 A | 11/2016 |
| CN | 107799576 A | 3/2018 |

* cited by examiner

*Primary Examiner* — Su C Kim
(74) *Attorney, Agent, or Firm* — Anova Law Group PLLC

(57) ABSTRACT

A display panel and a display device are provided. The display panel includes a display region, at least one notch, and a non-display region surrounding the display region. The display region includes an irregularly-shaped edge. The at least one notch is formed by recessing the irregularly-shaped edge toward an inside of the display region. The display panel also includes an array layer disposed on a side of a base substrate. The array layer includes at least one inorganic layer, the at least one inorganic layer including at least one protruded portion. In addition, the display panel includes a display function layer disposed on a side of the array layer away from the base substrate. Further, the display panel includes at least one blocking part formed in the non-display region. The at least one blocking part is disposed around the display region and around the display function layer.

20 Claims, 16 Drawing Sheets

DISPLAY PANEL AND DISPLAY DEVICE THEREOF

CROSS-REFERENCES TO RELATED APPLICATIONS

This application claims the priority of Chinese patent application No. 201811451431.4, filed on Nov. 30, 2018, the entirety of which is incorporated herein by reference.

FIELD OF THE DISCLOSURE

The present disclosure generally relates to the field of display technology and, more particularly, relates to a display panel and a display device thereof.

BACKGROUND

Existing display panel mainly includes a liquid-crystal display panel, an organic light-emitting display panel, and a plasma display panel, etc. With the development of science and technology, display panel manufacturing has also become more and more mature, and the requirements for display panel have become more and more diverse. Users are no longer satisfied with only the conventional performance indicators of the display panel, e.g., large size and high definition, and have more and more diverse requirements for the shape of the display panel. Therefore, an irregularly-shaped display panel has been emerged. The emergence of the irregularly-shaped display panel breaks through the limitation of the single rectangular structure of the display panel, which not only diversifies the display effect, but also widely extends the application of the display panel. The irregularly-shaped display panel has been successfully applied in the design of wearable electronics, e.g., a watch, glasses, or a smart bracelet, etc. In addition, the shape design of the irregularly-shaped display panel can avoid certain functional units, e.g., a camera unit, a sensor unit, or a speaker unit, etc., on the front panel of the display device. Therefore, a screen ratio of a display device is improved, and, thus, the display effect is substantially prominent.

However, in the prior art, after packaging the irregularly-shaped display panel, when the irregularly-shaped region is subjected to an impact, the packaging film layer easily cracks. After the crack extends to the display region, a dark spot is easily generated, thereby affecting display quality and display effect.

Therefore, there is an urgent need to provide a display panel and a display device capable of enhancing the packaging strength and improving the display quality. The disclosed display panel and display device are directed to solve one or more problems set forth above and other problems.

BRIEF SUMMARY OF THE DISCLOSURE

One aspect of the present disclosure provides a display panel. The display panel includes a display region, at least one notch, and a non-display region surrounding the display region. The display region includes a plurality of data lines and an irregularly-shaped edge, and the plurality of data lines and the irregularly-shaped edge each are extended along a first direction. The at least one notch is formed by recessing the irregularly-shaped edge toward an inside of the display region. The non-display region includes a first non-display region disposed adjacent to the at least one notch. The display panel also includes an array layer disposed on a side of a base substrate. The array layer includes at least one inorganic layer, the at least one inorganic layer being extended at least to the first non-display region and including at least one protruded portion in a direction perpendicular to a surface of the base substrate. In addition, the display panel includes a display function layer disposed on a side of the array layer away from the base substrate. The display function layer includes a light-emitting device and a pixel definition layer. Further, the display panel includes at least one blocking part formed in the non-display region. The at least one blocking part is disposed around the display region and around the display function layer. A vertical projection of the at least one protruded portion on the base substrate is a first projection, and the first projection is located within the first non-display region. A vertical projection of a portion of the blocking part in the first non-display region on the base substrate is a second projection. A vertical projection of the pixel definition layer on the base substrate is a third projection. The first projection is located between the second projection and the third projection.

Another aspect of the present disclosure provides a display device. The display device includes the disclosed display panel.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

Figure 1:
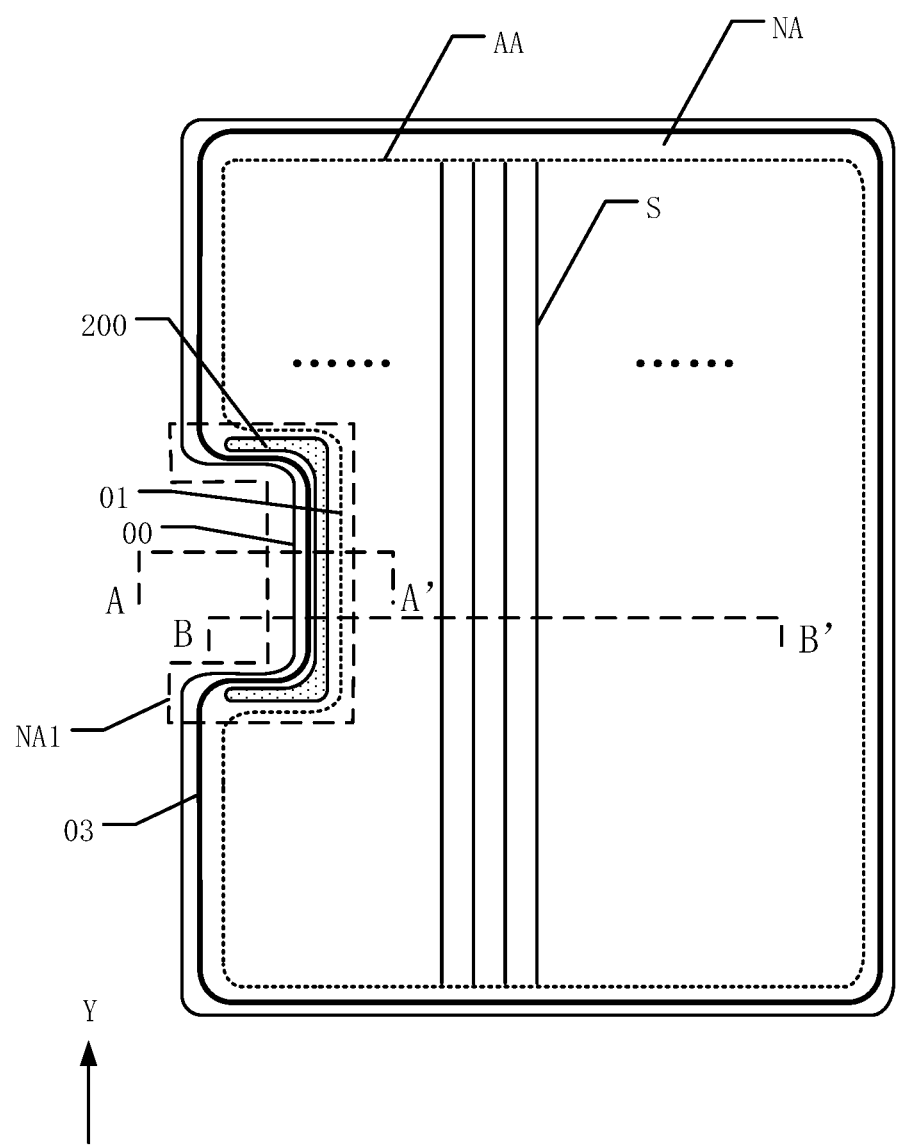
FIG. 1 illustrates a schematic top view of an exemplary display panel consistent with disclosed embodiments of the present disclosure.
Figure 2:
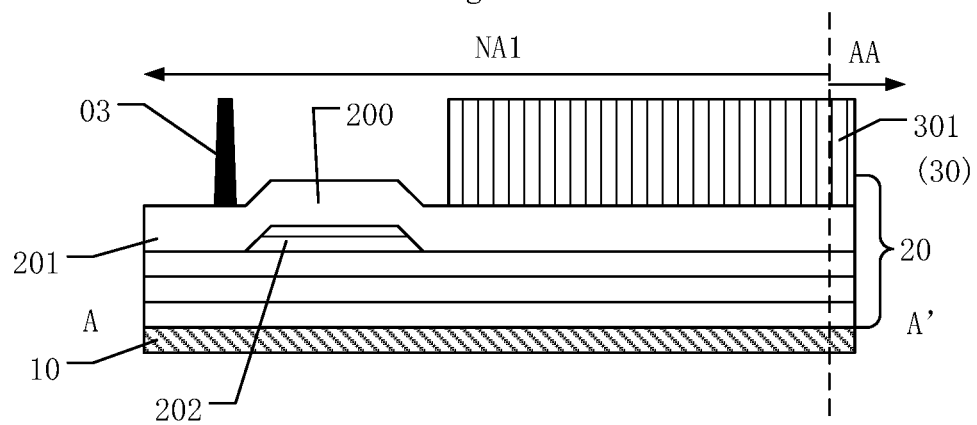
FIG. 2 illustrates a schematic A-A' sectional view of an exemplary display panel in FIG. 1 consistent with disclosed embodiments of the present disclosure.

FIG. 1 illustrates a schematic top view of a display panel consistent with disclosed embodiments of the present disclosure; and FIG. 2 illustrates a schematic A-A' sectional view of the display panel in FIG. 1. Referring to FIG. 1 and FIG. 2, the display panel may include a display region AA, a non-display region NA disposed around the display region AA, and at least one notch 00.

The display region AA may include a plurality of data lines S, and an irregularly-shaped edge 01. A data line S of the plurality of data lines and the irregularly-shaped edge 01 each may be extended in a first direction, such as a column direction Y as illustrated in FIG. 1. The irregularly-shaped edge 01 may be recessed toward an inside of the display region AA to form a notch 00. The non-display region NA may include a first non-display region NA1, and the first non-display region NA1 may be disposed adjacent to the notch 00.

The display panel may also include a base substrate 10, an array layer 20 and a display function layer 30. The array layer 20 may be disposed on a side of the base substrate 10. The array layer 20 may include at least one inorganic layer 201, and an inorganic layer 201 may be extended at least to the first non-display region NA1. The inorganic layer 201 may include at least one protruded portion 200 in a direction perpendicular to the base substrate 10.

The display function layer 30 may be disposed on a side of the array layer 20 away from the base substrate 10. The display function layer 30 may include a light-emitting device (not illustrated) and a pixel definition layer 301.

The non-display region NA may include at least one blocking part 03. A blocking part 03 may be disposed around the display region AA and around the display function layer 30.

A vertical projection of the protruded portion 200 on the base substrate 10 may be a first projection. The first projection may be located within the first non-display region NA1. A projection of a portion of the blocking part 03 in the first non-display region NA1 on the base substrate 10 may be a second projection. A vertical projection of the pixel definition layer 301 on the base substrate 10 may be a third projection. The first projection may be located between the second projection and the third projection.

In one embodiment, the notch 00 may be disposed on a side of the display panel having a same extension direction as the data line S. For the packaging structure at the notch 00 on the side of the display panel, the blocking part 03 in the non-display region NA may be first disposed, and the blocking part 03 may be disposed around the display region AA and around the display function layer 30. Therefore, the crack of the inorganic layer 201 caused during the cutting process of the display panel may be prevented from extending, and water and oxygen may be blocked from entering the inside of the display panel.

Moreover, in one embodiment, the protruded portion 200 may be disposed between the blocking part 03 and the pixel definition layer 301. In other words, the first projection may be located between the second projection and the third projection. The protruded portion 200 may be disposed in a same layer of the inorganic layer 201, and, thus, an uneven concavo-convex structure may be formed on a plane disposed between the blocking part 03 and the pixel definition layer 301 and parallel to a surface of the display panel.

When the notch 00 is impacted by an external force, if the protruded portion 200 is not disposed between the blocking part 03 and the pixel definition layer 301, because the inorganic layer 201 is often thick, hard and substantially brittle, the external impact may cause crack in the inorganic layer 201. The crack may have a diffusion direction concentrated along a tile direction of the inorganic layer 201 and may extend along a direction from the non-display region NA to the display region AA.

Therefore, in the disclosed embodiments, after disposing the protruded portion 200, which may be disposed in the same layer of the inorganic layer 201 and between the blocking part 03 and the pixel definition layer 301, when the notch 00 is impacted by the same external force, the diffusion direction of the external impact that causes crack in the inorganic layer 201 may be dispersed to directions other than the direction from the non-display region NA to the display region AA, e.g., a height direction of the protruded portion 200 (i.e., the direction perpendicular to the display panel). Therefore, the crack caused by external impact may be prevented from extending toward the display region AA as much as possible, or the speed at which the crack caused by external impact extends toward the display region AA may be slowed down. Dark spot may be prevented in the display region AA as much as possible, and, thus, the display effect and display quality of the display panel may not be affected.

Further, in the disclosed embodiments, because the vertical projection of the protruded portion 200 on the base substrate 10, i.e., the first projection, is located within the first non-display region NA1, and the notch 00 is formed by depressing the irregularly-shaped edge 01 extended in the column direction Y toward the inside of the display region AA, components used to drive the data line S, e.g., a driving chip, may not be necessarily disposed in the first non-display region NA1, such that sufficient space may be reserved for disposing the protruded portion 200.

To clearly illustrate the structure in the disclosed embodiments, FIG. 2 merely illustrates a part of the film layer structure, and other film layer structures (e.g., various dielectrics, etc.) and wires in the non-display region, which are not described in the technical solutions of the disclosed embodiments, are not illustrated. Those skilled in the art can have a related understanding in conjunction with the basic structure of the display panel in the prior art.

Further, the display panel in the disclosed embodiments may include a plurality of notches 00. For illustrative purposes, one notch 00 is exemplified to explain the working principle and beneficial effects of the disclosed embodiments. Those skilled in the art can understand that for the display panel having more than one notch 00, same structure may be provided to implement the same or similar technical effects in the disclosed embodiments, which is not described herein.

In certain embodiments, referring to FIG. 2, the array layer 20 in the first non-display region NA1 may further include a raised portion 202 on a side of the inorganic layer 201 adjacent to the base substrate 10. A vertical projection of the raised portion 202 on the base substrate 10 may overlap the first projection.

In the disclosed embodiments, the structure of the protruded portion 200 of the inorganic layer 201 may be formed by disposing the raised portion 202 between the protruded portion 200 and the base substrate 10. The vertical projection of the raised portion 202 on the base substrate 10 may overlap the projection of the protruded portion 200 onto base substrate 10. Therefore, by disposing the raised portion 202, the protruded portion 200 disposed between the blocking part 03 and the pixel definition layer 301 may be formed. Because of the protruded portion 200, the uneven concavo-convex structure may be formed on the plane disposed between the blocking part 03 and the pixel definition layer 301 and parallel to the surface of the display panel. Therefore, the crack caused by external impact may be prevented from extending toward the display region AA as much as possible, or the speed at which the crack caused by external impact extends toward the display region AA may be slowed down. Dark spot may be prevented in the display region AA as much as possible, and, thus, the display effect and display quality of the display panel may not be affected.

Moreover, in the disclosed embodiments, because the raised portion 202 is disposed in the first non-display region NA1 adjacent to the notch 00, and the notch 00 is formed by depressing the irregularly-shaped edge 01 extended in the column direction Y toward the inside of the display region AA, components used to drive the data line S, e.g., a driving chip, may not be necessarily disposed in the first non-display region NA1, such that sufficient space may be reserved for disposing the raised portion 200.

Further, in the disclosed embodiments, the structure of the protruded portion 200 of the inorganic layer 201 may be formed through the raised portion 202. On the one hand, the crack caused by external impact may be prevented from extending toward the display region AA as much as possible, or the speed at which the crack caused by external impact extends toward the display region AA may be slowed down. Dark spot may be prevented in the display region AA as much as possible, and, thus, the display effect and display quality of the display panel may not be affected. On the other hand, the protruded portion 200 may actually be formed by two film layers made of different materials. In other words, the protruded portion 200 may be formed by the raised portion 202 and the inorganic layer 201 together.

Compared to a non-protruded region of the inorganic layer 201, the inorganic layer 201 in the protruded region may be boosted to another plane by the raised portion 202. If a crack appears in the inorganic layer 201, the crack may not only be intercepted by the raised portion 202, but also consume a certain amount of energy between different film layers (e.g., the crack penetrating an interface between the raised portion 202 and the inorganic layer 201, the crack extending from one plane height to another plane height, where the plane height may refer to a vertical distance from the plane to the base substrate). Therefore, a trend of the crack continuously extending toward the display region AA may be reduced.

In the disclosed embodiments, the protruded portion 200 of the inorganic layer 201 may be formed by disposing the raised portion 202 on a film layer between the protruded portion 200 and the base substrate 10. As long as after disposing the raised portion 202, the uneven concave-convex structure is formed on the plane disposed between the blocking part 03 and the pixel definition layer 301 and parallel to the surface of the display panel, the film layer(s) on which the raised portion 202 is provided is not limited by the present disclosure. Therefore, the crack caused by external impact may be prevented from extending toward the display region AA as much as possible, or the speed at which the crack caused by external impact extends toward the display region AA may be slowed down.

Figure 3:
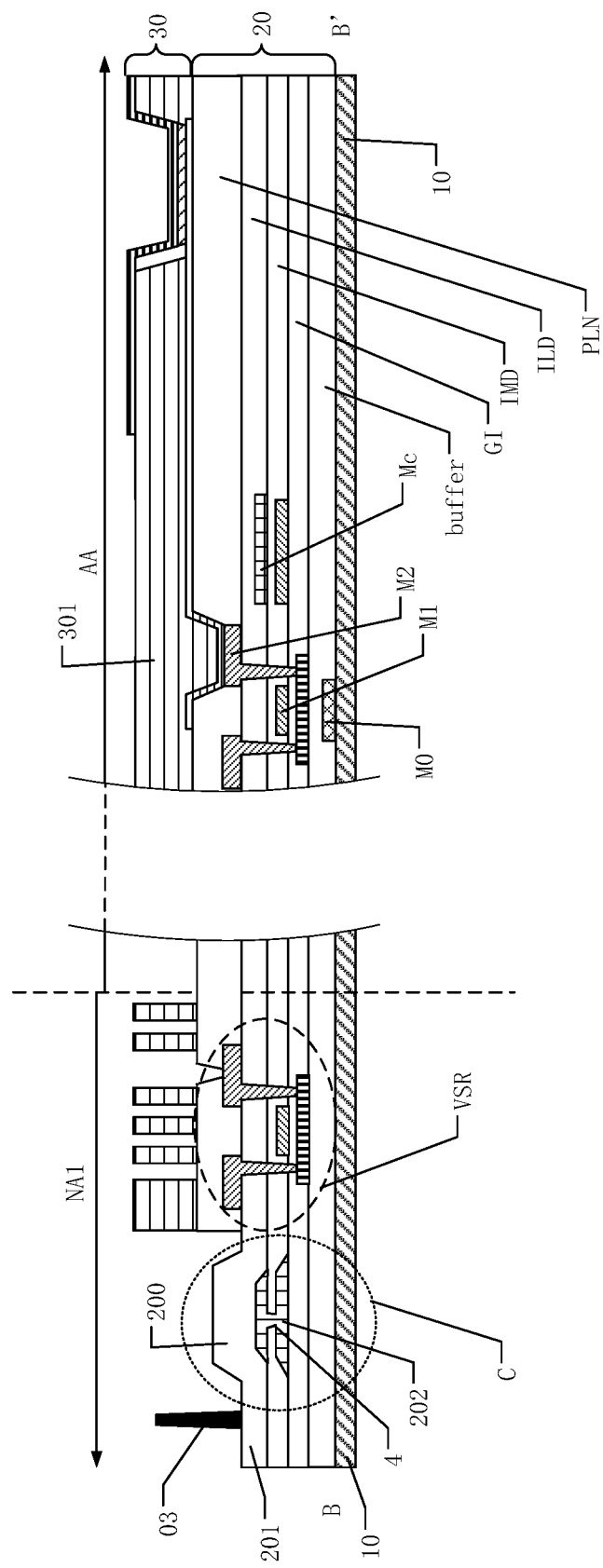
FIG. 3 illustrates a schematic B-B' sectional view of an exemplary display panel in FIG. 1 consistent with disclosed embodiments of the present disclosure.

FIG. 3 illustrates a schematic B-B' sectional view of the display panel in FIG. 1. In certain embodiments, referring to FIG. 3, the raised portion 202 may include a number of raised portions 202 disposed in different film layers. Projections of the plurality of raised portions 202 disposed in different film layers on the base substrate 10 may overlap each other.

As such, the disclosed raised portion may include multiple raised portions 202, disposed in different film layers and having projections on the base substrate 10 overlap each other, such that the inorganic layer 201 may be raised up by the raised portions 202 disposed in different film layers. As a result, the protruded portion 200 and the non-protruded region of the inorganic layer 201 may be out of a plane, thereby improving the effect of intercepting the crack. At the same time, a height of a single raised portion 202 may be prevented from being formed too high to penetrate through the above film layers, and the disappearance or breakage of the protruded portion 200 of the inorganic layer 201 caused by peeling or breakage of the single raised portion 202 may be avoided. Therefore, the effect of preventing the crack from extending toward the display region AA may be further improved, and the dark spot may be prevented in the display region AA.

In certain embodiments, referring to FIG. 3, the plurality of raised portions 202 disposed in different film layers may be electrically connected to each other through a via 4. In the disclosed embodiments, a connection relationship between the plurality of raised portions 202 disposed in different film layers may be further defined. In other words, the plurality of raised portions 202 disposed in different film layers may be electrically connected to each other through the via 4. Therefore, the plurality of raised portions 202 disposed in different film layers may conduct in parallel, and when being electrically connected to any other wire (e.g., a low-potential wire), a resistance of the wire may be reduced and a voltage drop of the wire may be improved. Moreover, because the plurality of raised portions 202 disposed in different film layers are electrically connected to each other through the via 4, the plurality of raised portions 202 disposed in different film layers may be prevented from being peeled off by external factors, thereby improving the structural stability of the entire display panel.

In certain embodiments, referring to FIG. 2 and FIG. 3, the raised portion 202 may be made of a metal material. In the disclosed embodiments, the raised portion 202 being made of a metal material may be further defined. The metal material may have desired impact resistance and electrical conductivity, which may prevent the crack caused by the external impact from extending toward the display region AA. At the same time, the raised portion 202 may be electrically connected to any other wire (e.g., a low-potential wire) through the electrical conductivity of the metal material, and, thus, a resistance of the wire may be reduced, and a voltage drop of the wire may be improved. The type of the metal material of the raised portion 202 is not limited by the present disclosure.

In certain embodiments, referring to FIG. 3, the array layer 20 may include a gate metal layer M1, a source/drain metal layer M2, a capacitor metal layer Mc, and a light-shielding metal layer M0. The raised portion 202 may be disposed in a same layer with a same material as one or more selected from the gate metal layer M1, the source/drain metal layer M2, the capacitor metal layer M0, and the light-shielding metal layer M0.

In the disclosed embodiments, the structure of the array layer 20 of the display panel may be further explained. In one embodiment, the array layer 20 may include the light-shielding layer M0 formed on the base substrate 10; a buffer layer (buffer) formed on the light-shielding layer M0; a semiconductor layer (not illustrated) formed on the buffer layer (buffer); a gate insulator GI formed on the semiconductor layer; the gate metal layer M1 formed on the gate insulator GI; an inter-metal dielectric IMD formed on the gate metal layer M1; the capacitor metal layer Mc formed on the inter-metal dielectric IMD; an interlayer dielectric ILD formed on the capacitor metal layer Mc; the source/drain metal layer M2 formed on the interlayer dielectric ILD; and a planarization layer PLN formed on the source/drain metal layer M2.

The array layer 20 may include the gate metal layer M1, the source/drain metal layer M2, the capacitor metal layer Mc, and the light-shielding metal layer M0. The buffer layer (buffer), the gate insulator GI, the inter-metal dielectric IMD, the interlayer dielectric ILD, and other inorganic layers may desire to be formed between adjacent metal film layers to achieve the insulation purpose. The raised portion 202 may be disposed in a same layer with a same material as one or more selected from the gate metal layer M1, the source/drain metal layer M2, the capacitor metal layer Mc, and the light-shielding metal layer M0. Thus, the inorganic layer 201 on a side of the metal film layer disposed in a same layer with a same material as the raised portion 202 away from the base substrate 10 may automatically form the protruded portion 200. Therefore, the uneven concavo-convex structure may be formed on the plane disposed between the blocking part 03 and the pixel definition layer 301 and parallel to the surface of the display panel.

Further, in the disclosed embodiments, the raised portion 202 may be disposed in a same layer with a same material as one or more selected from the gate metal layer M1, the capacitor metal layer Mc, and the light-shielding metal layer M0. In other words, the raised portions 202 may multiplex any one or more of the gate metal layer M1, the capacitor metal layer Mc, and the light-shielding metal layer M0. The at least one inorganic layer 201 may multiplex any one or more of the buffer layer (buffer), the gate insulator GI, the inter-metal dielectric IMD, and the interlayer dielectric ILD. Therefore, the manufacturing process may be simplified, and an overall thickness of the display panel may be reduced. Moreover, in the disclosed embodiments, because the vertical projection of the raised portion 202 on the base substrate 10 is located within the first non-display region NA1, and the notch 00 is formed by recessing the irregularly-shaped edge 01 extended in the column direction Y toward the inside of the display region AA, the raised portion 202 may be disposed on a side of the first non-display region NA1 where the gate driving circuit VSR is located. The components used to drive the data line S, e.g., a driving chip, may not be necessarily disposed in the first non-display region NA1, such that sufficient space may be reserved to allow the gate metal layer M1, the capacitor metal layer Mc, and the light-shielding metal layer M0 to be extended to the first non-display region NA1 for disposing the protruded portion 200.

To clearly illustrate the technical solutions of the present disclosure, FIG. 3 in the disclosed embodiments may simply illustrate stacked structure of the film layers of the array layer 20. The array layer 20 including the associated metal film layer structure is used as an example in the present disclosure. The array layer may include any other suitable film layer structure, which is not limited by the present disclosure and is not described herein. The thin film transistor in the array layer 20 in the disclosed embodiments is described using a top gate structure as an example. The thin film transistor may have any other suitable structure, e.g., a bottom gate structure, which is not limited by the present disclosure and is not described herein.

In certain embodiments, referring to FIG. 3, the gate metal layer M1 may be disposed on a side of the base substrate 10. The capacitor metal layer Mc may be disposed on a side of the gate metal layer M1 away from the base substrate 10. The source/drain metal layer M2 may be disposed on a side of the capacitor metal layer Mc away from the base substrate 10. The light-shielding metal layer M0 may be disposed between the base substrate 10 and the gate metal layer M1.

In the disclosed embodiments, the positional relationship of the gate metal layer M1, the source/drain metal layer M2, the capacitor metal layer Mc, and the light-shielding metal layer M0 on the array layer 20, respectively, may be further explained. The gate metal layer M1 and the source/drain metal layer M2 may be used to fabricate the thin film transistor on the array layer 20. The capacitor metal layer Mc may be disposed between the gate metal layer M1 and the source/drain metal layer M2 to function as a capacitor. The light-shielding metal layer M0 may block the light incident on the thin film transistor, thereby improving the operational stability of the thin film transistor.

Figure 4:
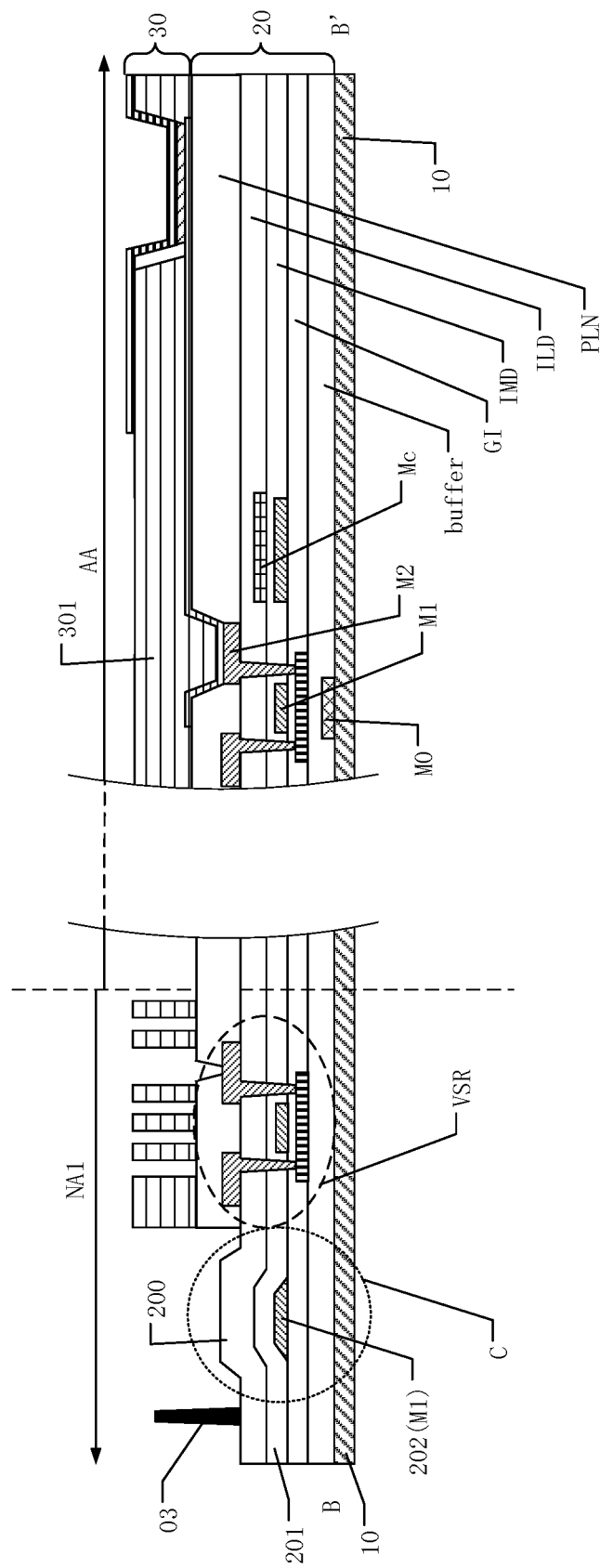
FIG. 4 illustrates another schematic B-B' sectional view of an exemplary display panel in FIG. 1 consistent with disclosed embodiments of the present disclosure.
Figure 5:
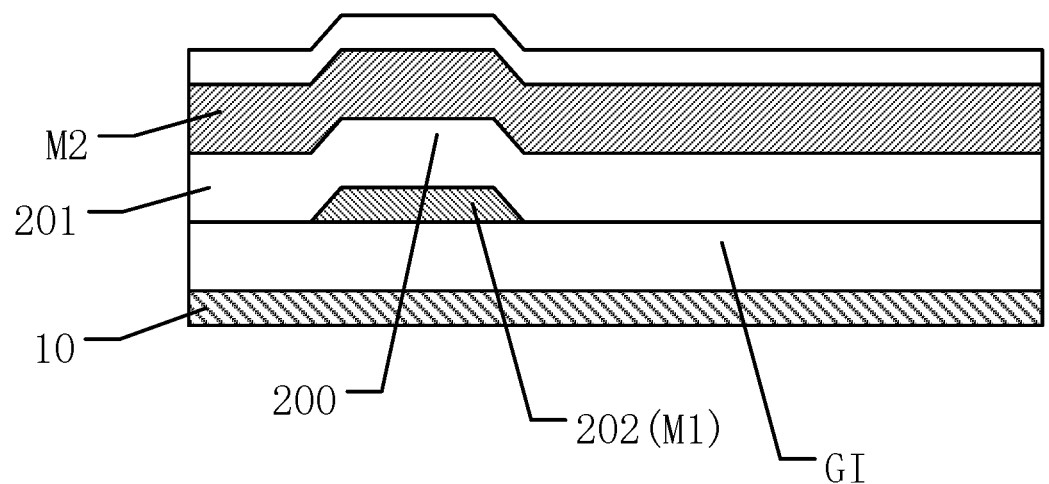
FIG. 5 illustrates a local zoom-in view of a region C in FIG. 4 consistent with disclosed embodiments of the present disclosure.

FIG. 4 illustrates another schematic B-B' sectional view of the display panel in FIG. 1, and FIG. 5 illustrates a local zoom-in view of a region C in FIG. 4. In certain embodiments, referring to FIG. 4 and FIG. 5, the at least one inorganic layer 201 may be disposed between the gate metal layer M1 and the source/drain metal layer M2, and the raised portion 202 may be disposed in a same layer of the gate metal layer M1.

In one embodiment, for the structure of the array layer 20 where the gate metal layer M1 is disposed on a side of the base substrate 10, the capacitor metal layer Mc is disposed on a side of the gate metal layer M1 away from the base substrate 10, the source/drain metal layer M2 is disposed on a side of the capacitor metal layer Mc away from the base substrate 10, and the light-shielding metal layer M0 is disposed between the base substrate 10 and the gate metal layer M1, an arrangement position of the raised portion 202 may be further exemplified. The raised portion 202 may be disposed in a same layer of the gate metal layer M1. Therefore, the at least one inorganic layer 201 (including the inter-metal dielectric IMD disposed between the gate metal layer M1 and the capacitor metal layer Mc, and the interlayer dielectric ILD disposed between the capacitor metal layer Mc and the source/drain metal layer M2) disposed between the gate metal layer M1 and the source/drain metal layer M2 may form the protruded portion 200 through the raised portion 202. Thus, the uneven concavo-convex structure may be formed on the plane disposed between the blocking part 03 and the pixel definition layer 301 and parallel to the surface of the display panel. The concave-convex structure may prevent the crack caused by external impact from extending toward the display region AA as much as possible, or may slow down the speed at which the crack caused by external impact extends toward the display region AA. Dark spot may be prevented in the display region AA as much as possible, and, thus, the display effect and display quality of the display panel may not be affected.

In the disclosed embodiments, other inorganic layers, e.g., the gate insulator GI, and the buffer layer, etc., may be disposed between the raised portion 202 and the base substrate 10 within the first non-display region NA1, which is not described herein. In one embodiment, referring to FIG. 5, the source/drain metal layer M2 may be extended into the first non-display region NA1 for use as a PVEE wire, and may be electrically connected to a low-potential signal in the display region AA. At the same time, an anode wire extending from the display region AA (not illustrated in FIG. 5) may be disposed above the source/drain metal layer M2 within the first non-display region NA1, connected to a high-potential signal, and fit the PVEE wire.

Figure 6:
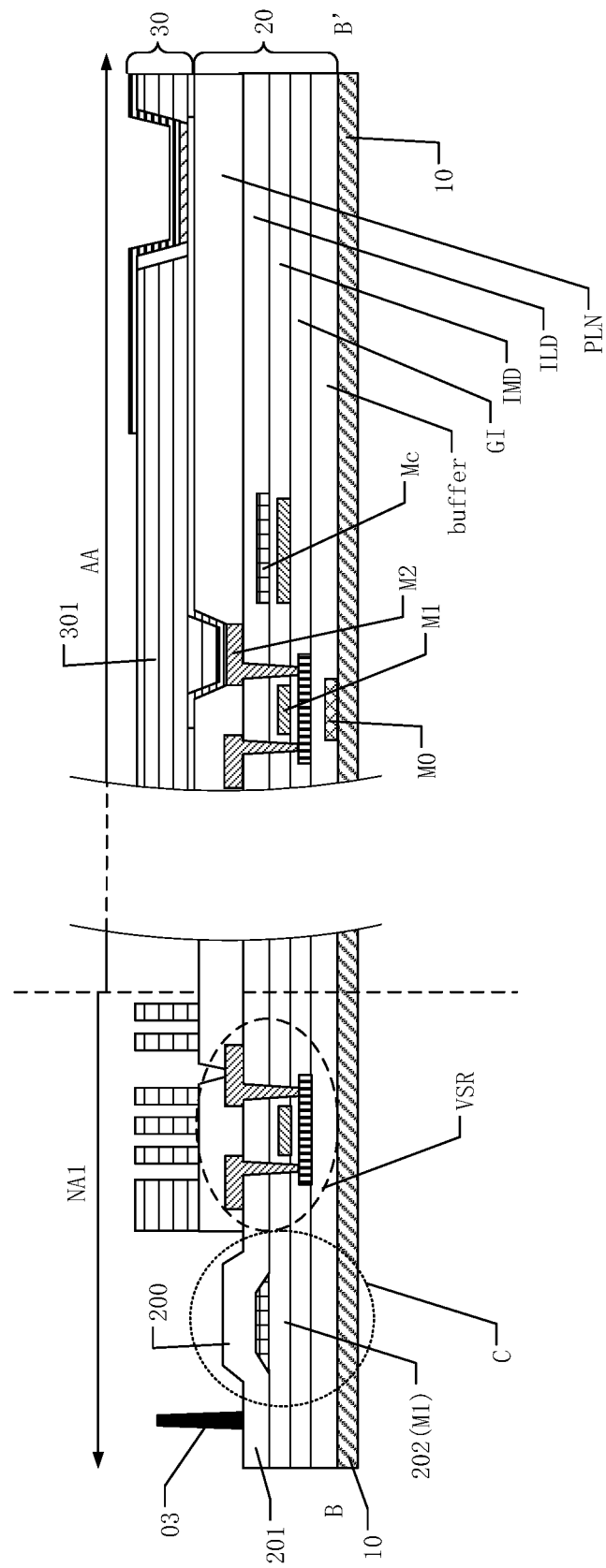
FIG. 6 illustrates another schematic B-B' sectional view of an exemplary display panel in FIG. 1 consistent with disclosed embodiments of the present disclosure.
Figure 7:
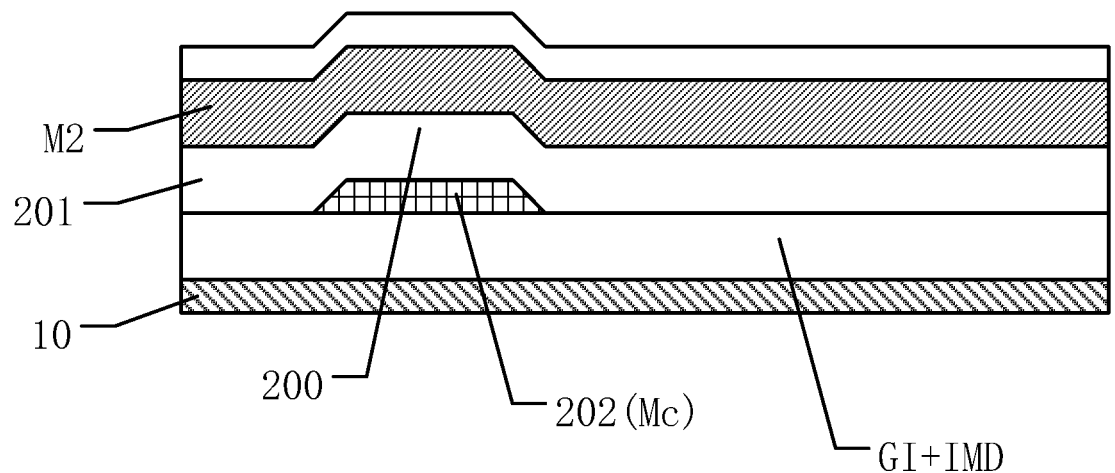
FIG. 7 illustrates a local zoom-in view of a region C in FIG. 6 consistent with disclosed embodiments of the present disclosure.

FIG. 6 illustrates another schematic B-B' sectional view of the display panel in FIG. 1, and FIG. 7 illustrates a local zoom-in view of a region C in FIG. 6. In certain embodiments, referring to FIG. 6 and FIG. 7, the at least one inorganic layer 201 may be disposed between the capacitor metal layer Mc and the source/drain metal layer M2, and the raised portion 202 may be disposed in a same layer of the capacitor metal layer Mc.

In one embodiment, for the structure of the array layer 20 where the gate metal layer M1 is disposed on a side of the base substrate 10, the capacitor metal layer Mc is disposed on a side of the gate metal layer M1 away from the base substrate 10, the source/drain metal layer M2 is disposed on a side of the capacitor metal layer Mc away from the base substrate 10, and the light-shielding metal layer M0 is disposed between the base substrate 10 and the gate metal layer M1, another arrangement position of the raised portion 202 may be further exemplified. The raised portion 202 may be disposed in the same layer of the capacitor metal layer Mc. Therefore, the at least one inorganic layer 201 (including the interlayer dielectric ILD disposed between the capacitor metal layer Mc and the source/drain metal layer M2) disposed between the capacitor metal layer Mc and the source/drain metal layer M2 may form the protruded portion 200 through the raised portion 202. Thus, the uneven concavo-convex structure may be formed on the plane disposed between the blocking part 03 and the pixel definition layer 301 and parallel to the surface of the display panel. The concave-convex structure may prevent the crack caused by external impact from extending toward the display region AA as much as possible, or may slow down the speed at which the crack caused by external impact extends toward the display region AA. Dark spot may be prevented in the display region AA as much as possible, and, thus, the display effect and display quality of the display panel may not be affected.

In the disclosed embodiments, other inorganic layers, e.g., the gate insulator GI, the buffer layer, and the inter-metal dielectric IMD, etc., may be disposed between the raised portion 202 and the base substrate 10 within the first non-display region NA1, which is not described herein.

Figure 8:
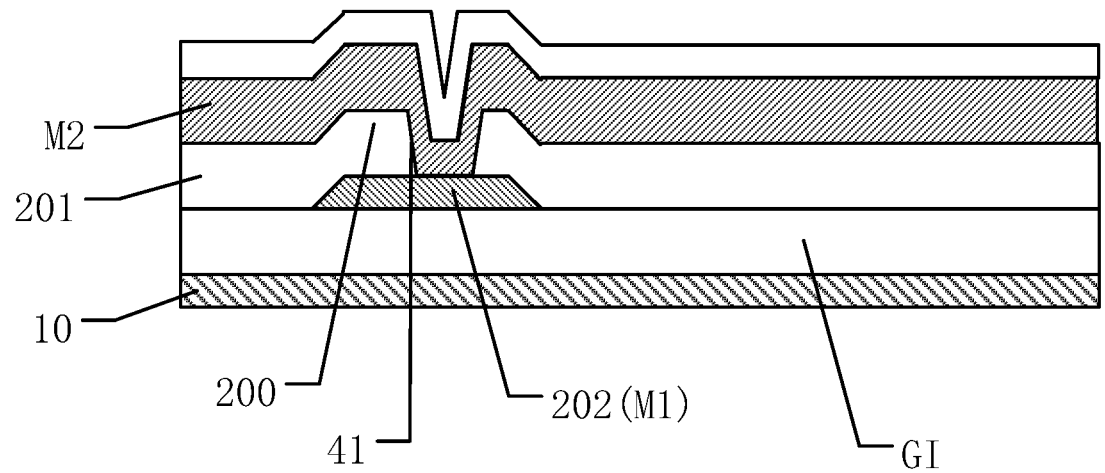
FIG. 8 illustrates another local zoom-in view of a region C in FIG. 4 consistent with disclosed embodiments of the present disclosure.
Figure 9:
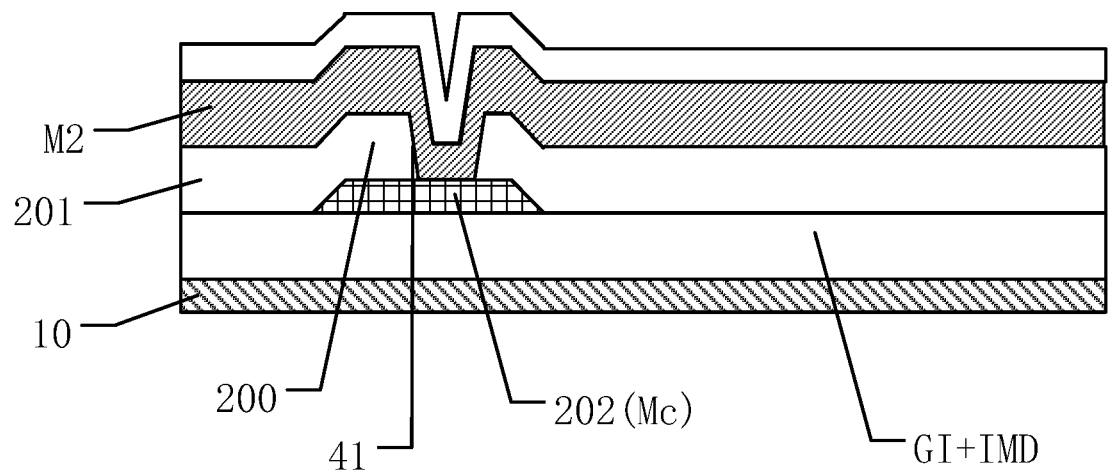
FIG. 9 illustrates another local zoom-in view of a region C in FIG. 6 consistent with disclosed embodiments of the present disclosure.

FIG. 8 illustrates another local zoom-in view of the region C in FIG. 4, and FIG. 9 illustrates another local zoom-in view of the region C in FIG. 6. In certain embodiments, referring to FIG. 8 and FIG. 9, the raised portion 202 may be electrically connected to the source/drain metal layer M2 through a first via 41.

In the disclosed embodiments, the raised portion 202 electrically connecting to the source/drain metal layer M2 through the first through 41 may be further defined. The source/drain metal layer M2 as a low-potential signal wire in the first non-display region NA1 may be disposed above the raised portion 202. In other words, the source/drain metal layer M2 may be connected to a low-potential signal. The raised portion 202 may be electrically connected to the low-potential signal of the source/drain metal layer M2 through the first via 41. Therefore, a resistance of the source/drain metal layer M2 as the low-potential signal wire may be reduced, and a voltage drop of the low-potential signal wire may be improved.

Figure 10:
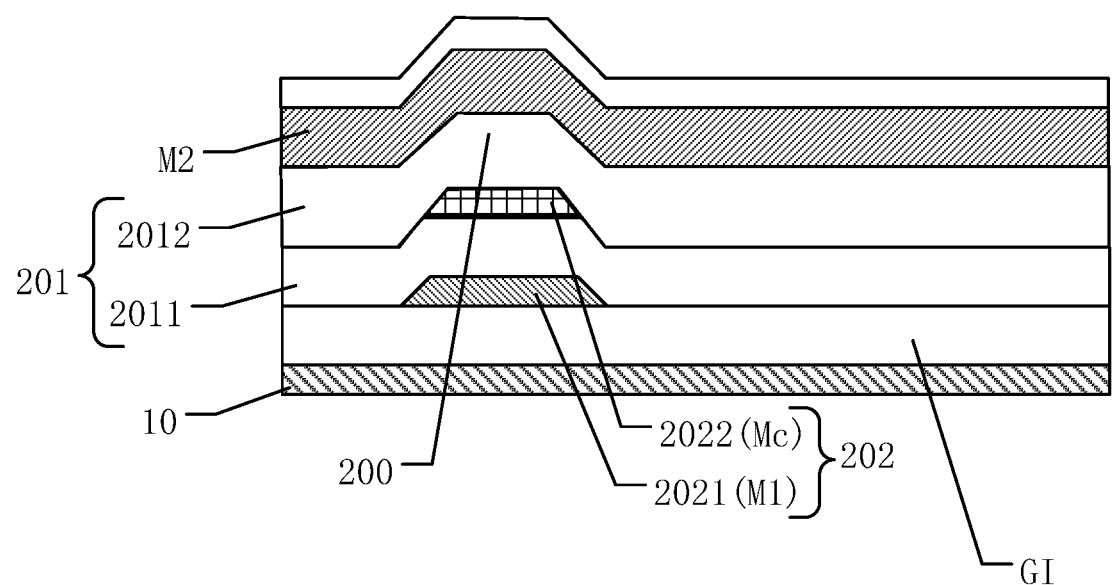
FIG. 10 illustrates a local zoom-in view of a region C in FIG. 3 consistent with disclosed embodiments of the present disclosure.

FIG. 10 illustrates a local zoom-in view of the region C in FIG. 3. In certain embodiments, referring to FIG. 10, the at least one inorganic layer 201 may include a first inorganic layer 2011 and a second inorganic layer 2012. The first inorganic layer 2011 may be disposed between the gate metal layer M1 and the capacitor metal layer Mc. The second inorganic layer 2012 may be disposed between the capacitor metal layer Mc and the source/drain metal layer M2.

The raised portion 202 may include a first raised portion 2021 and a second raised portion 2022 that are disposed in different film layers. The first raised portion 2021 may be disposed in a same layer of one of the gate metal layer M1 and the capacitor metal layer Mc, and the second raised portion 2022 may be disposed in a same layer of the other of the gate metal layer M1 and the capacitor metal layer Mc.

In one embodiment, for the structure of the array layer 20 where the gate metal layer M1 is disposed on a side of the base substrate 10, the capacitor metal layer Mc is disposed on a side of the gate metal layer M1 away from the base substrate 10, the source/drain metal layer M2 is disposed on a side of the capacitor metal layer Mc away from the base substrate 10, and the light-shielding metal layer M0 is disposed between the base substrate 10 and the gate metal layer M1, another arrangement position of the raised portion 202 may be further exemplified. The raised portion 202 may include the first raised portion 2021 and the second raised portion 2022 that are disposed in different film layers. Therefore, the first inorganic layer 2011 (i.e., the inter-metal dielectric IMD) disposed between the gate metal layer M1 and the capacitor metal layer Mc may form a protruded portion 200 through the first raised portion 2021. At the same time, the second inorganic layer 2012 (i.e., the interlayer dielectric ILD) disposed between the capacitor metal layer Mc and the source/drain metal layer M2 may form another protruded portion 200 through the second raised portion 2022.

Therefore, a height of the overall protruded portion 200 in the direction perpendicular to the display panel may further increase, and a concavo-convex degree of the uneven concavo-convex structure formed on the plane disposed between the blocking part 03 and the pixel definition layer 301 and parallel to the surface of the display panel may further increase. The crack caused by external impact may be effectively prevented from extending toward the display region AA, or the speed at which the crack caused by external impact extends toward the display region AA may be effectively slowed down. Dark spot may be further prevented in the display region AA, and, thus, the display effect and display quality of the display panel may not be affected.

In the disclosed embodiments, other inorganic layers, e.g., the gate insulator GI, the buffer layer, etc., may be disposed between the first raised portion 2021 and the base substrate 10 within the first non-display region NA1, which is not described herein.

Figure 11:
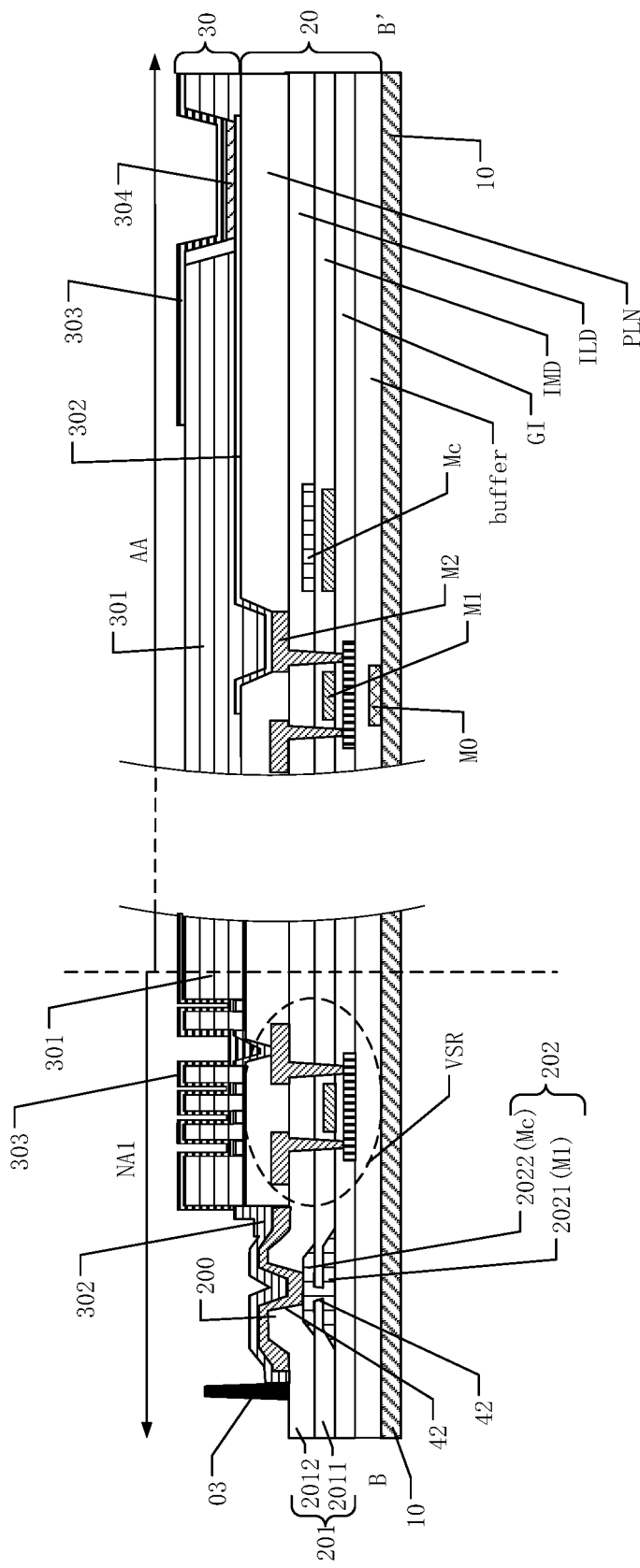
FIG. 11 illustrates another schematic B-B' sectional view of an exemplary display panel in FIG. 1 consistent with disclosed embodiments of the present disclosure.

FIG. 11 illustrates another schematic B-B' sectional view of the display panel in FIG. 1. In certain embodiments, referring to FIG. 11, the display function layer 30 may include an anode layer 302, an organic light-emitting layer 304, and a cathode layer 303 that are sequentially stacked in the direction perpendicular to the display panel. One or more of the first raised portion 2021 and the second raised portion 2022 may be electrically connected to the cathode layer 303 through a second via 42.

In the disclosed embodiments, the film layer structure of the display function layer 30 may be further explained. The display function layer 30 may include the anode layer 302, the organic light-emitting layer 304, and the cathode layer 303 that are sequentially stacked in the direction perpendicular to the display panel. One or more of the first raised portion 2021 and the second raised portion 2022 may be electrically connected to the cathode layer 303 through the second via 42. In other words, after the first raised portion 2021 and the second raised portion 2022 are electrically connected to each other through the second via 42, the first raised portion 2021 and the second raised portion 2022 may be electrically connected to the cathode layer 303 through the second via 42. Therefore, a resistance of the wire may be further reduced, and a voltage drop of the wire may be further improved.

Figure 12:
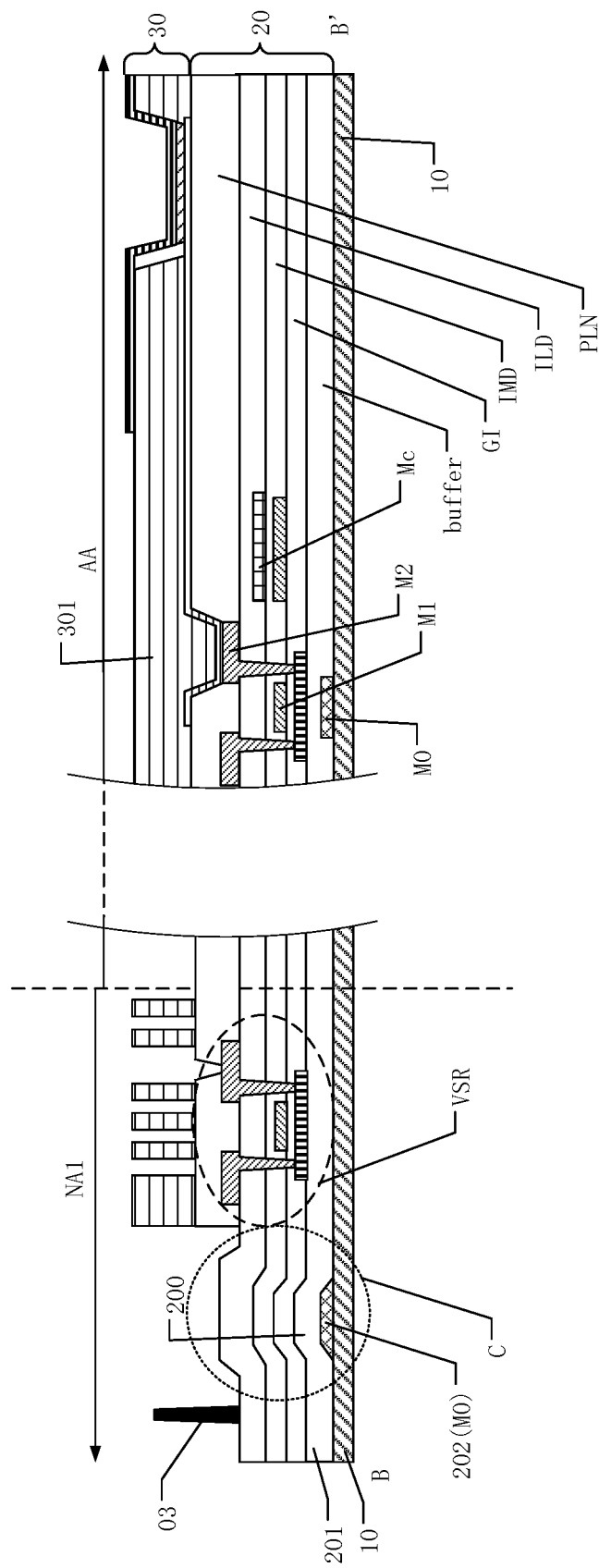
FIG. 12 illustrates another schematic B-B' sectional view of an exemplary display panel in FIG. 1 consistent with disclosed embodiments of the present disclosure.
Figure 13:
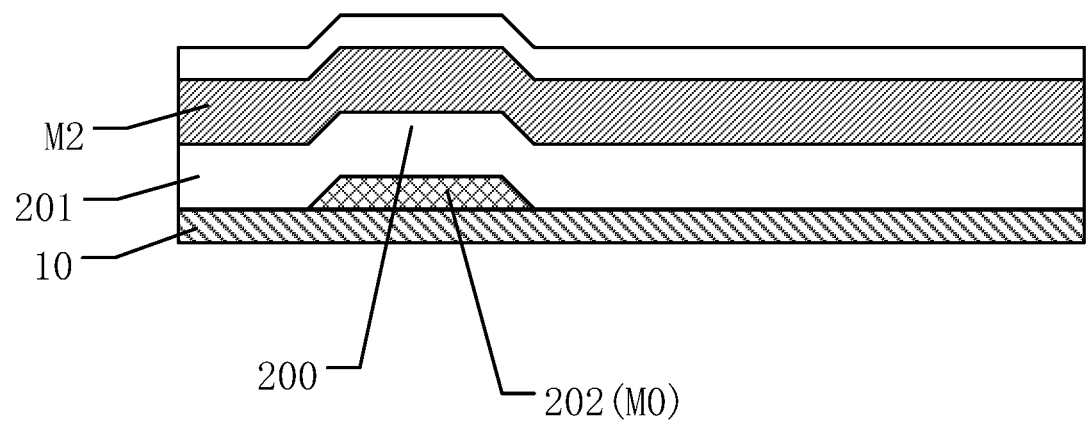
FIG. 13 illustrates a local zoom-in view of a region C in FIG. 12 consistent with disclosed embodiments of the present disclosure.

FIG. 12 illustrates another schematic B-B' sectional view of the display panel in FIG. 1, and FIG. 13 illustrates a local zoom-in view of a region C in FIG. 12. In certain embodiments, referring to FIG. 12 and FIG. 13, the at least one inorganic layer 201 may be disposed between the light-shielding metal layer M0 and the gate metal layer M1, and the raised portion 202 may be disposed in a same layer of the light-shielding metal layer M0.

In one embodiment, for the structure of the array layer 20 where the gate metal layer M1 is disposed on a side of the base substrate 10, the capacitor metal layer Mc is disposed on a side of the gate metal layer M1 away from the base substrate 10, the source/drain metal layer M2 is disposed on a side of the capacitor metal layer Mc away from the base substrate 10, and the light-shielding metal layer M0 is disposed between the base substrate 10 and the gate metal layer M1, another arrangement position of the raised portion 202 may be further exemplified. The raised portion 202 may be disposed in the same layer of the light-shielding metal layer M0. Therefore, the at least one inorganic layer 201 (i.e., the gate insulator GI disposed between the light-shielding metal layer M0 and the gate metal layer M1) disposed between the light-shielding metal layer M0 and the gate metal layer M1 may form the protruded portion 200 through the raised portion 202. Therefore, the uneven concavo-convex structure may be formed on the plane disposed between the blocking part 03 and the pixel definition layer 301 and parallel to the surface of the display panel. The crack caused by external impact may be prevented from extending toward the display region AA as much as possible, or the speed at which the crack caused by external impact extends toward the display region AA may be slowed down. Dark spot may be prevented in the display region AA as much as possible, and, thus, the display effect and display quality of the display panel may not be affected.

Figure 14:
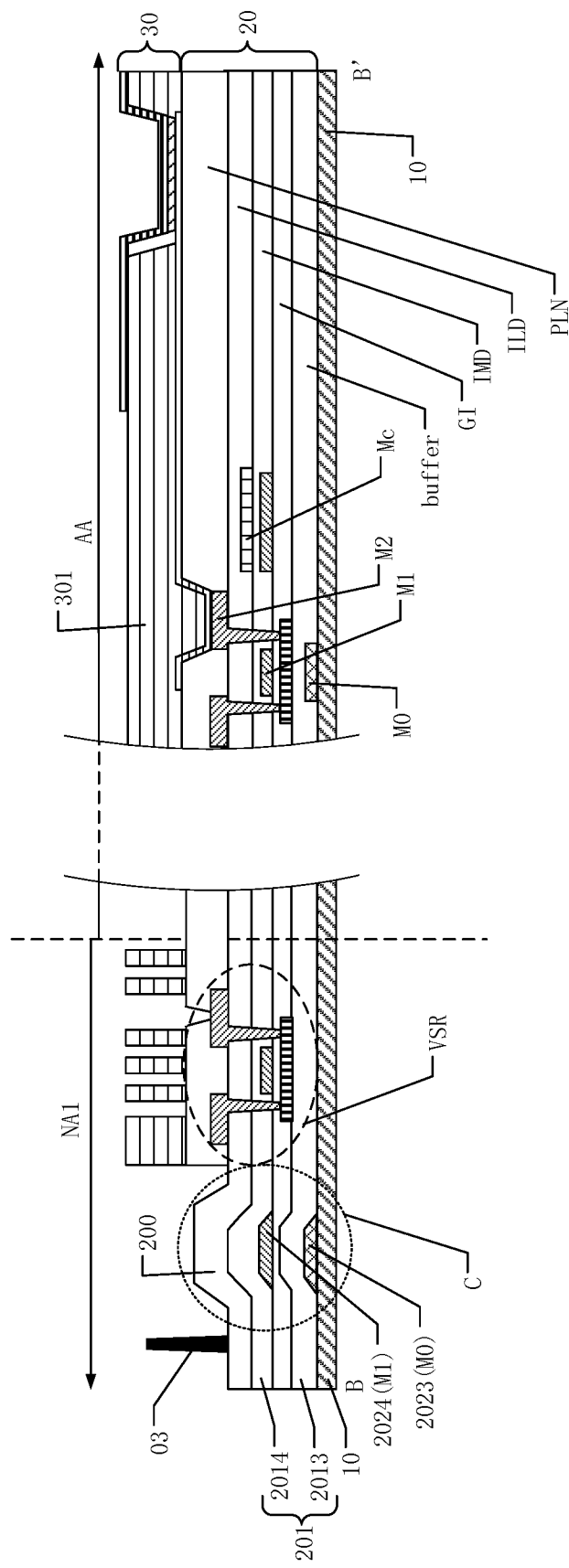
FIG. 14 illustrates another schematic B-B' sectional view of an exemplary display panel in FIG. 1 consistent with disclosed embodiments of the present disclosure.
Figure 15:
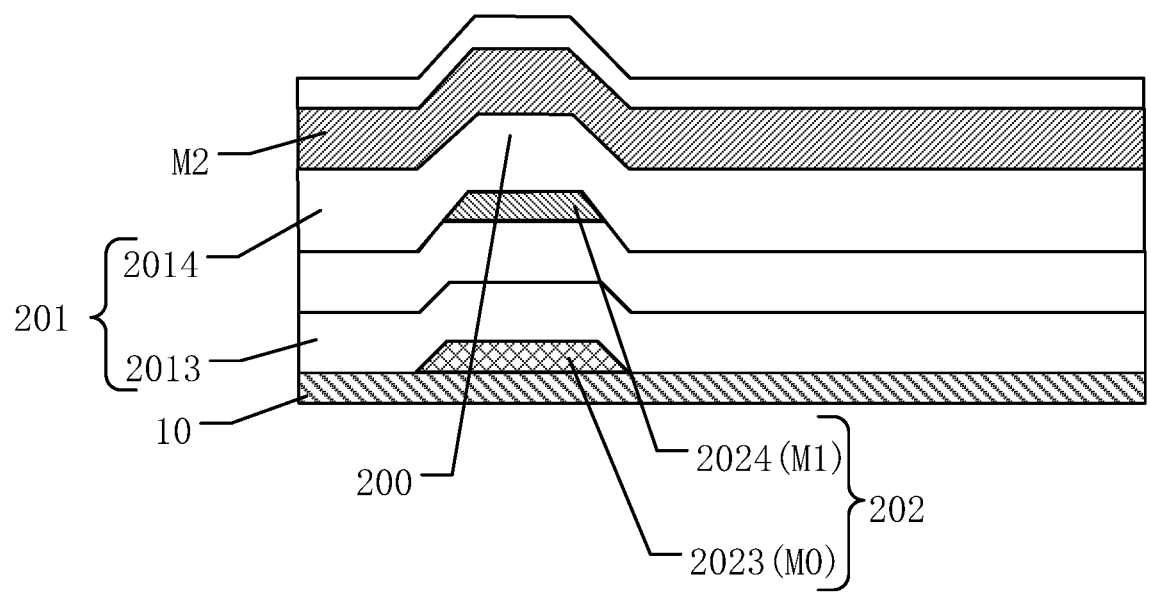
FIG. 15 illustrates a local zoom-in view of a region C in FIG. 14 consistent with disclosed embodiments of the present disclosure.

FIG. 14 illustrates another schematic B-B' sectional view of the display panel in FIG. 1, and FIG. 15 illustrates a local zoom-in view of a region C in FIG. 14. In certain embodiments, referring to FIG. 14 and FIG. 15, the at least one inorganic layer 201 may include a third inorganic layer 2013 and a fourth inorganic layer 2014. The third inorganic layer 2013 may be disposed between the light-shielding metal layer M0 and the gate metal layer M1. The fourth inorganic layer 2014 may be disposed between the gate metal layer M1 and the capacitor metal layer Mc.

The raised portion 202 may include a third raised portion 2023 and a fourth raised portion 2024 that are disposed in different film layers. The third raised portion 2023 may be disposed in a same layer of one of the gate metal layer M1 and the light-shielding metal layer M0, and the fourth raised portion 2024 may be disposed in a same layer of the other of the gate metal layer M1 and the light-shielding metal layer M0.

In one embodiment, for the structure of the array layer 20 where the gate metal layer M1 is disposed on a side of the base substrate 10, the capacitor metal layer Mc is disposed on a side of the gate metal layer M1 away from the base substrate 10, the source/drain metal layer M2 is disposed on a side of the capacitor metal layer Mc away from the base substrate 10, and the light-shielding metal layer M0 is disposed between the base substrate 10 and the gate metal layer M1, another arrangement position of the raised portion 202 may be further exemplified. The raised portion 202 may include the third raised portion 2023 and the fourth raised portion 2024 that are disposed in different film layers. Therefore, the third inorganic layer 2013 (i.e., the gate insulator GI) disposed between the light-shielding metal layer M0 and the gate metal layer M1 may form a protruded portion 200 through the third raised portion 2023. At the same time, the fourth inorganic layer 2014 (i.e., the inter-metal dielectric IMD) disposed between the gate metal layer M1 and the capacitor metal layer Mc may form another protruded portion 200 through the fourth raised portion 2024.

Therefore, a height of the overall protruded portion 200 in the direction perpendicular to the display panel may further increase, and a concavo-convex degree of the uneven concavo-convex structure formed on the plane disposed between the blocking part 03 and the pixel definition layer 301 and parallel to the surface of the display panel may further increase. The crack caused by external impact may be effectively prevented from extending toward the display region AA, or the speed at which the crack caused by external impact extends toward the display region AA may be effectively slowed down. Dark spot may be further prevented in the display region AA, and, thus, the display effect and display quality of the display panel may not be affected.

In the disclosed embodiments, the arrangement position of the raised portions 202 having a quantity of two may be exemplified. The raised portions may have any other suitable arrangement position, which is not limited by the present disclosure. In one embodiment, a quantity of the raised portions 202 may be three. In other words, the three raised portions 202 disposed in different layers may be disposed in a same layer with a same material as the light-shielding metal layer M0, the gate metal layer M1, and the capacitor metal layer Mc, respectively. Therefore, the concavo-convex degree of the uneven concavo-convex structure formed on the plane disposed between the blocking part 03 and the pixel definition layer 301 and parallel to the surface of the display panel may further increase. Further, one or more of the third raised portion 2023 and the fourth raised portion 2024 in the disclosed embodiments may be electrically connected to the cathode layer through a third via (not illustrated). Therefore, a resistance of the wire may be further reduced, and a voltage drop of the wire may be further improved.

Figure 16:
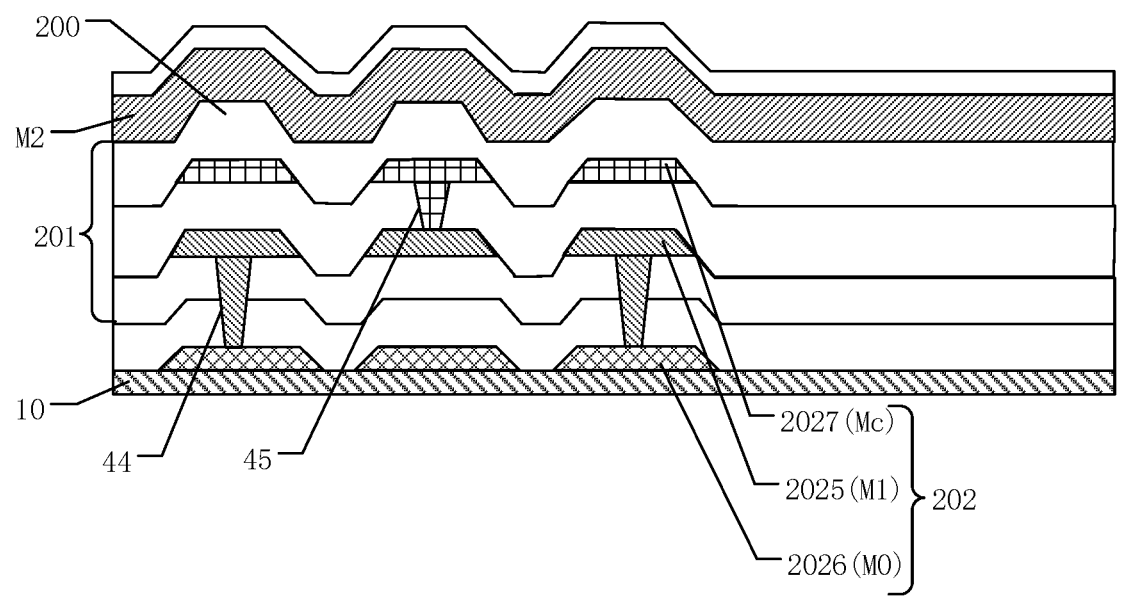
FIG. 16 illustrates another local zoom-in view of a region C in FIG. 14 consistent with disclosed embodiments of the present disclosure.

FIG. 16 illustrates another local zoom-in view of the region C in FIG. 14. In certain embodiments, referring to FIG. 16, the raised portion 202 may include a plurality of groups of raised portions sequentially disposed in a direction away from the irregularly-shaped edge 01. Each group of raised portions may include a fifth raised portion 2025, a sixth raised portion 2026, and a seventh raised portion 2027. In the direction perpendicular to the surface of the display panel, the fifth raised portion 2025 may be disposed between the sixth raised portion 2026 and the seventh raised portion 2027. One of adjacent fifth raised portions 2025 may be electrically connected to a sixth raised portion 2026 through a fourth via 44, and the other of the adjacent fifth raised portions 2025 may be electrically connected to a seventh raised portion 2027 through a fifth via 45.

As such, the disclosed each group of raised portions may include three raised portions 202 disposed in different film layers, which are the fifth raised portion 2025, the sixth raised portion 2026, and the seventh raised portion 2027, respectively. In the direction perpendicular to the display panel, the fifth raised portion 2025 may be disposed between the sixth raised portion 2026 and the seventh raised portion 2027. Therefore, the concavo-convex degree of the uneven concavo-convex structure formed on the plane disposed between the blocking part 03 and the pixel definition layer 301 and parallel to the surface of the display panel may further increase.

Moreover, in a case when the display panel does not have too high requirements on the narrow frame, more numbers of groups of raised portions, each including the fifth raised portion 2025, the sixth raised portion 2026, and the seventh raised portion 2027, may be sequentially disposed in the direction away from the irregularly-shaped edge 01. Therefore, the quantity and width of overall protruded portion 200 in the direction parallel to the display panel may increase. Thus, the crack caused by external impact may be further prevented from extending toward the display region AA, dark spot may be prevented in the display region AA, and the display effect and display quality may not be affected.

In one embodiment, in a case where the plurality of groups of raised portions, each including the fifth raised portion 2025, the sixth raised portion 2026, and the seventh raised portion 2027, are sequentially disposed in the direction away from the irregularly-shaped edge 01, due to limitation of the production process, the etched via may not be too deep. Otherwise, the requirements may not be met. In the disclosed embodiments, one of adjacent fifth raised portions 2025 may be electrically connected to a sixth raised portion 2026 through the fourth via 44, and the other of the adjacent fifth raised portions 2025 may be electrically connected to a seventh raised portion 2027 through the fifth via 45. Therefore, the fifth raised portion 2025, the sixth raised portion 2026 and the seventh raised portion 2027 disposed in different film layers may be electrically connected to each other without etching a too deep via, thereby reducing the process difficulty and improving the working efficiency. Electrically connecting the fifth raised portion 2025, the sixth raised portion 2026, and the seventh raised portion 2027 disposed in different film layers to each other may further reduce the resistance of the wire and improve the voltage drop of the wire.

Figure 17:
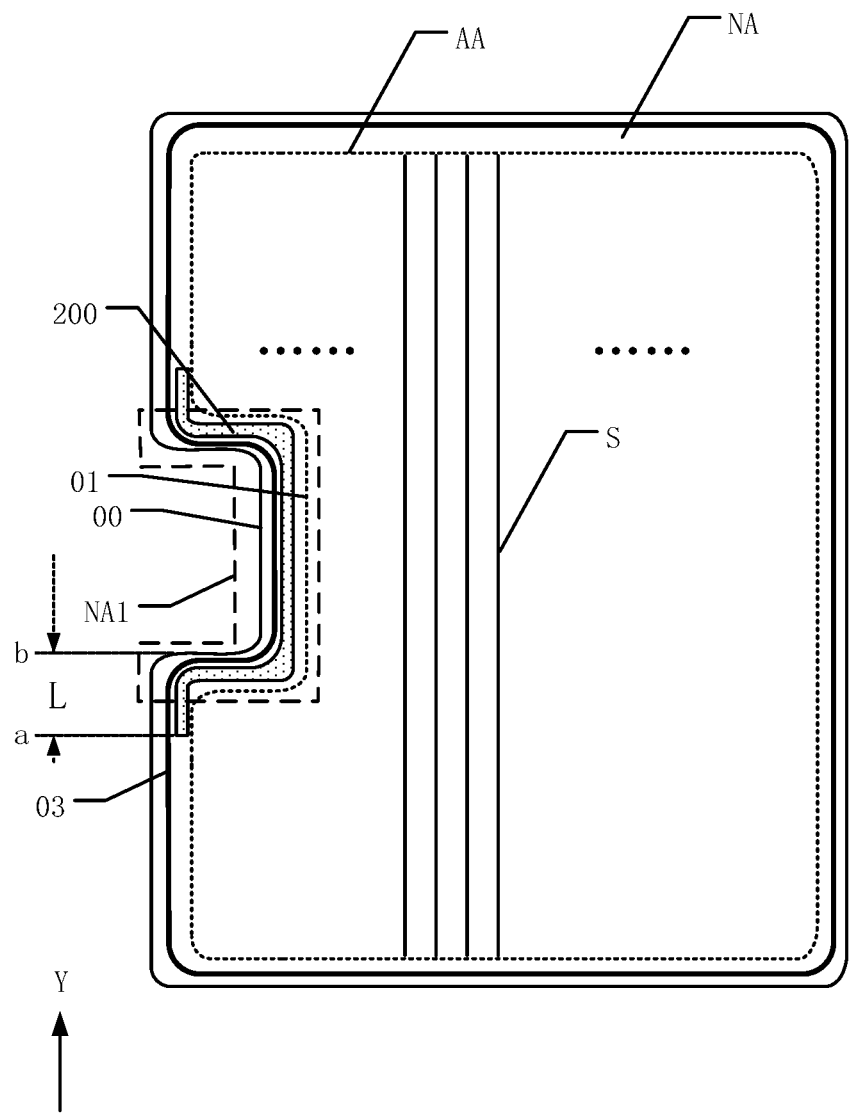
FIG. 17 illustrates a schematic top view of another exemplary display panel consistent with disclosed embodiments of the present disclosure.
Figure 18:
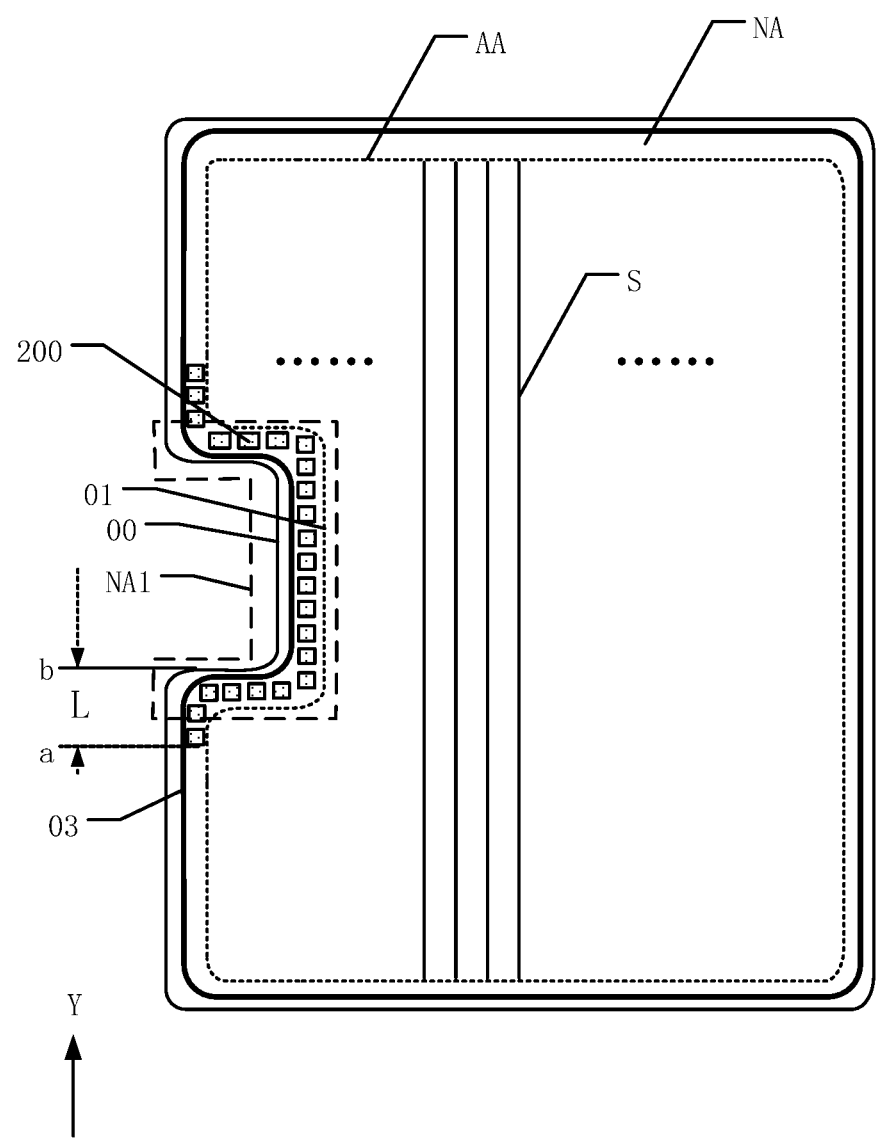
FIG. 18 illustrates a schematic top view of another exemplary display panel consistent with disclosed embodiments of the present disclosure.

FIG. 17 illustrates a schematic top view of another display panel consistent with disclosed embodiments of the present disclosure; and FIG. 18 illustrates a schematic top view of another display panel consistent with disclosed embodiments of the present disclosure. In certain embodiments, referring to FIG. 17 and FIG. 18, the shape of each of the protruded portion 200 and the raised portion 202 may be one of a strip structure and an island structure.

In the disclosed embodiments, the shape of each of the protruded portion 200 and the raised portion 202 being one of the strip structure and the island structure may be further defined. In one embodiment, the shape of each of the protruded portion 200 and the raised portion 202 may be designed as the strip structure (as illustrated in FIG. 17). In another embodiment, the shape of each of the protruded portion 200 and the raised portion 202 may be designed as the island structure (as illustrated in FIG. 18). Because the low-potential wire electrically connected to the raised portion 202 through the via is often manufactured after manufacturing the light-emitting device of the display function layer 30, the low-potential wire is not easy to be etched and often occupies a full face. The gate metal layer M1 and the source/drain metal layer M2 each may often be disposed in a same layer of a shift register unit, respectively. When the raised portion 202 is disposed in the same layer of the gate metal layer M1, the raised portion may have to keep away from the wire, and may not be suitable to be connected in a large area. Therefore, the shape of each of the protruded portion 200 and the raised portion 202 being one of the strip structure and the island structure may facilitate implementation of the technical solutions in the disclosed embodiments.

In the actual manufacturing production, when a product (e.g., a daily mobile phone, etc.) comprising the produced display panel is predicted to be more likely to be impacted by an external force during use, the shape of each of the protruded portion 200 and the raised portion 202 may be designed as the strip structure. The protruded portion 200 with the strip structure may not have gap, and, thus, the crack generated by impacting the notch 00 may be prevented from extending toward the display region AA in all aspects. When the notch 00 is impacted by an external force, a diffusion direction of the crack may be guided to a length extension direction of the strip-shaped protruded portion 200, thereby further preventing the crack from extending toward the display region AA. When a product (e.g., a laptop, a television, etc.) comprising the produced display panel is predicted to be less likely to be impacted by an external force during use, the shape of each of the protruded portion 200 and the raised portion 202 may be designed as the island structure. Therefore, the crack generated by impacting the notch 00 may be prevented from extending toward the display region AA as much as possible. At the same time, the material used for disposing the protruded portion 200 may be saved, thereby saving production costs.

In certain embodiments, referring to FIG. 17 and FIG. 18, in the column direction Y, a length of the protruded portion 200 may be greater than a length of the irregularly-shaped edge 01.

In the disclosed embodiments, in the column direction Y, the length of the protruded portion 200 being greater than the length of the irregularly-shaped edge 01 may be further defined. In other words, the length of the protruded portion 200 may be greater than a length of the notch 00, and, thus, when the notch 00 is impacted by an external force, the protruded portion 200 may be extended a little to both sides of the notch 00 in the column direction Y to provide a desired buffering effect, and to protect the notch 00 against external impact in all aspects. On the other hand, because the protruded portion 200 has the length greater than the irregularly-shaped edge 01 in the column direction Y, before the crack reaches the notch 00 formed at the irregularly-shaped edge 01, the protruded portion 200 may intercept the extension of the crack or slow down the speed at which the crack extends toward the display region AA. Therefore, dark spot may be further prevented in the display region AA, and, thus, the display effect and display quality of the display panel may not be affected.

In certain embodiments, referring to FIG. 17 and FIG. 18, in the column direction Y, an end of the first projection may be a first end 'a', and an end of the irregularly-shaped edge 01 may be a second end 'b'. The first end 'a' and the second end 'b' may be located on a same side of the notch 00, and a distance 'L' between the first end 'a' and the second end 'b' may be in a range of approximately 5 µm-200 µm.

In the disclosed embodiments, the protruded portion 200 extending a certain length to both sides of the notch 00 in the column direction Y may be further defined. In other words, the first end 'a' of the orthogonal projection of the protruded portion 200 onto the display panel and the second end 'b' of the orthogonal projection of the irregularly-shaped edge 01 onto the display panel may be located on a same side of the notch 00. The distance 1' between the first end 'a' and the second end 'b' may be in a range of approximately 5 µm-200 µm. Therefore, before the crack reaches a distance of approximately 5 µm-200 µm in front of the notch 00 formed at the irregularly-shaped edge 01, the protruded portion 200 may intercept the extension of the crack. Thus, dark spot may be prevented in the display region AA, and the display effect and display quality of the display panel may not be affected. Further, the protruded portion 200 may buffer the external impact onto the notch 00 in all aspects.

Figure 19:
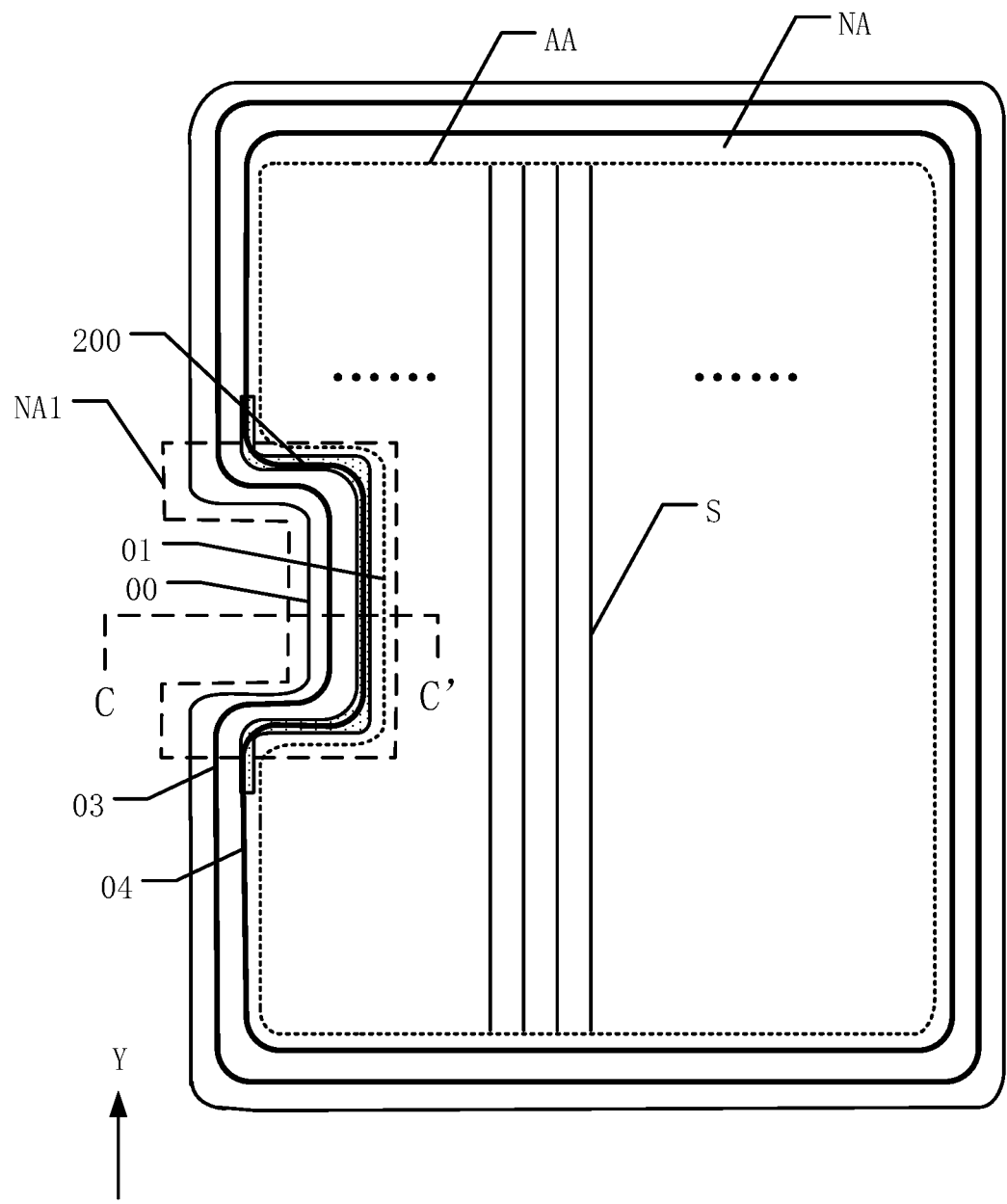
FIG. 19 illustrates a schematic top view of another exemplary display panel consistent with disclosed embodiments of the present disclosure.
Figure 20:
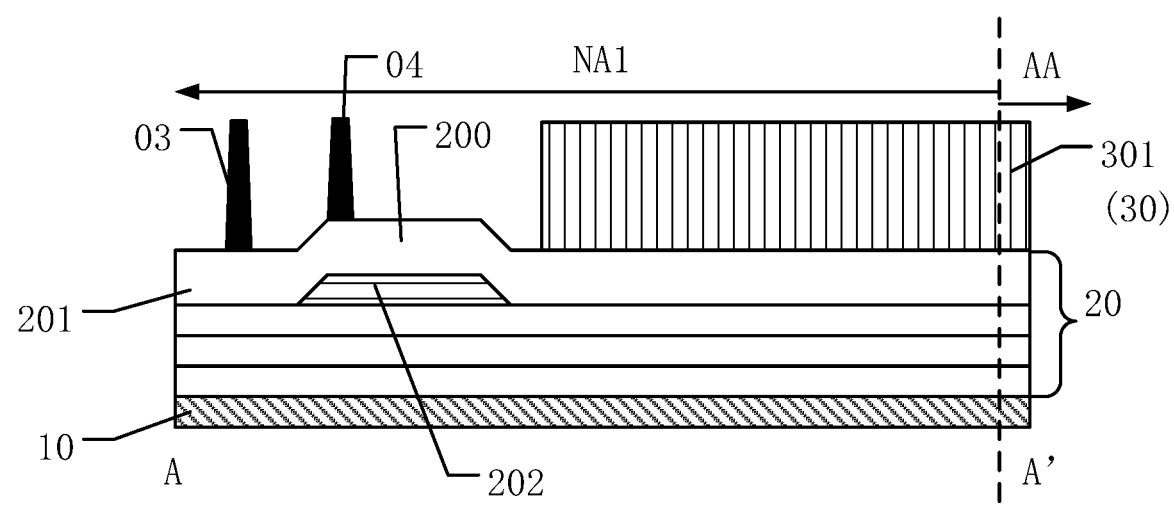
FIG. 20 illustrates a schematic C-C' sectional view of an exemplary display panel in FIG. 19 consistent with disclosed embodiments of the present disclosure.

FIG. 19 illustrates a schematic top view of another display panel consistent with disclosed embodiments of the present disclosure; and FIG. 20 illustrates a schematic C-C' sectional view of the display panel in FIG. 19. In certain embodiments, referring to FIG. 19 and FIG. 20, the non-display region NA may further include an auxiliary blocking part 04. The auxiliary blocking part 04 may be disposed around the display region AA and around the display function layer 30. The auxiliary blocking part 04 may be disposed on a side of the blocking part 03 adjacent to the display region AA.

In the disclosed embodiments, the auxiliary blocking part 04 disposed on the side of the blocking part 03 adjacent to the display region AA may be further provided. Therefore, the blocking part 03 and the auxiliary blocking part 04 together may prevent water and oxygen from entering the inside of the display panel. At the same time, a substantially high protruded structure may be formed by overlying the auxiliary blocking part 04 and the protruded portion 200 in the direction perpendicular to the display panel (because the auxiliary blocking part 04 is disposed on the side of the blocking part 03 adjacent to the display region AA, the auxiliary blocking part 04 may be highly likely to overlap the protruded portion 200 in the direction perpendicular to the display panel). Thus, the crack may be extended on the height of the film layer formed by overlying the auxiliary blocking part 04 and the protruded portion 200 to further consume the energy of the crack diffusion, thereby further weakening a trend of the crack continuously extending toward the display region AA.

In certain embodiments, referring to FIG. 19 and FIG. 20, a projection of the auxiliary blocking part 04 on the base substrate 10 may at least partially overlap the first projection.

In the disclosed embodiments, the projection of the auxiliary blocking part 04 on the base substrate 10 may at least partially overlap the first projection of the protruded portion 200 on the base substrate 10. In other words, the first projection may desire to be located between the blocking part 03 and the pixel definition layer 301, and may not desire to be narrowed down to be located between the auxiliary blocking part 04 and the pixel definition layer 301. Therefore, a distance between the protruded portion 200 and the notch 00 in the direction parallel to the display panel may be as large as possible, to effectively slow down the speed at which the crack caused by external impact extends toward the display region AA, and to effectively prevent the dark spot in the display region AA.

Figure 21:
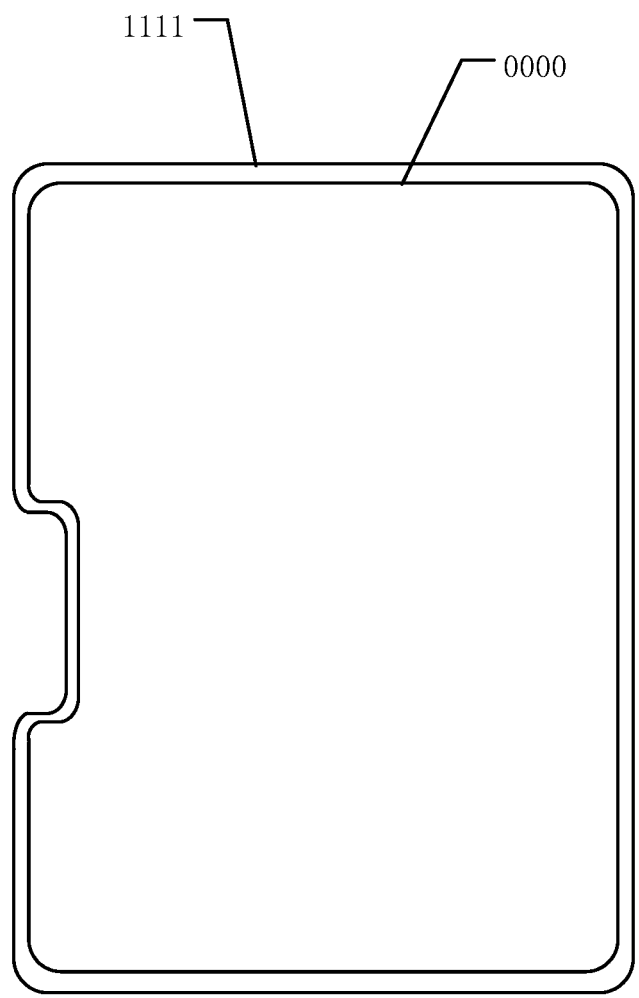
FIG. 21 illustrates a schematic top view of an exemplary display device consistent with disclosed embodiments of the present disclosure.

FIG. 21 illustrates a schematic top view of a display device consistent with disclosed embodiments of the present disclosure. In certain embodiments, referring to FIG. 21, the display device 1111 may include a display panel 0000 provided in any of the foregoing embodiments of the present disclosure. For illustrative purpose, the display device 1111 as a mobile phone may be described. The display device 1111 in the disclosed embodiments may be any other suitable display device having a display function, e.g., a computer, a television, an electronic paper, and an in-vehicle display device, etc., which is not limited by the present disclosure. The display device 1111 in the disclosed embodiments may also have the beneficial effects described in the above embodiments, which are not repeated herein.

In the display panel and the display device in the disclosed embodiments, the notch may be disposed on the side of the display panel having a same extension direction as the data line. For the packaging structure at the notch on the side of the display panel, the blocking part in the non-display region may be first disposed, and the blocking part may be disposed around the display region and around the display function layer. Therefore, the crack of the inorganic layer caused during the cutting process of the display panel may be prevented from extending, and water and oxygen may be blocked from entering the inside of the display panel.

Moreover, the protruded portion may be disposed between the blocking part and the pixel definition layer. In other words, the first projection may be located between the second projection and the third projection. The protruded portion may be disposed in a same layer of the inorganic layer, and, thus, the uneven concavo-convex structure may be formed on the plane disposed between the blocking part and the pixel definition layer and parallel to the surface of the display panel.

When the notch is impacted by an external force, if the protruded portion is not disposed between the blocking part and the pixel definition layer, because the inorganic layer is often thick, hard and substantially brittle, the external impact may cause crack in the inorganic layer. The crack may have a diffusion direction concentrated along the tile direction of the inorganic layer and may extend along a direction from the non-display region to the display region. In the disclosed embodiments, after providing the protruded portion, which may be disposed in the same layer of the inorganic layer and between the blocking part and the pixel definition layer, when the notch is impacted by the same external force, the diffusion direction of the external impact that causes crack in the inorganic layer may be dispersed to directions other than the direction from the non-display region to the display region, e.g., the height direction of the protruded portion. Therefore, the crack caused by external impact may be prevented from extending toward the display region as much as possible, or the speed at which the crack caused by external impact extends toward the display region may be slowed down. Dark spot may be prevented in the display region as much as possible, and, thus, the display effect and display quality of the display panel may not be affected.

Further, in the disclosed embodiments, because the vertical projection of the protruded portion on the base substrate, i.e., the first projection, is located in the first non-display region, and the notch is formed by depressing the irregularly-shaped edge extended in the column direction toward the inside of the display region, components used to drive the data line, e.g., a driving chip, may not be necessarily disposed in the first non-display region, such that sufficient space may be reserved for disposing the protruded portion.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments illustrated herein but is to be accorded the widest scope consistent with the principles and novel features disclosed herein.

What is claimed is:

1. A display panel, comprising:
   a display region, wherein the display region includes a plurality of data lines and an irregularly-shaped edge, and the plurality of data lines and the irregularly-shaped edge each are extended along a first direction;
   at least one notch, formed by recessing the irregularly-shaped edge toward an inside of the display region;
   a non-display region, surrounding the display region, wherein the non-display region includes a first non-display region disposed adjacent to the at least one notch;
   an array layer, disposed on a side of a base substrate, wherein the array layer includes at least one inorganic layer, the at least one inorganic layer being extended at least to the first non-display region and including at least one protruded portion in a direction perpendicular to a surface of the base substrate;
   a display function layer, disposed on a side of the array layer away from the base substrate, wherein the display function layer includes a light-emitting device and a pixel definition layer; and
   at least one blocking part, formed in the non-display region, wherein the at least one blocking part is disposed around the display region and around the display function layer,
   wherein:
   a vertical projection of the at least one protruded portion on the base substrate is a first projection, and the first projection is located within the first non-display region,
   a vertical projection of a portion of the blocking part in the first non-display region on the base substrate is a second projection,
   a vertical projection of the pixel definition layer on the base substrate is a third projection, and
   the first projection is located between the second projection and the third projection.

2. The display panel according to claim 1, wherein:
   the array layer in the first non-display region further includes a raised portion disposed on a side of the at least one inorganic layer adjacent to the base substrate; and
   a vertical projection of the raised portion on the base substrate overlaps the first projection.

3. The display panel according to claim 2, wherein:
   the raised portion includes a number of raised portions, disposed in different film layers; and
   projections of the number of raised portions disposed in different film layers on the base substrate overlap each other.

4. The display panel according to claim 3, wherein:
   the number of raised portions disposed in different film layers are electrically connected to each other through a via.

5. The display panel according to claim 2, wherein:
   the raised portion is made of a metal material.

6. The display panel according to claim 2, wherein:
   the array layer further includes a gate metal layer, a source/drain metal layer, a capacitor metal layer, and a light-shielding metal layer; and
   the raised portion is disposed in a same layer with a same material as one or more selected from the gate metal layer, the source/drain metal layer, the capacitor metal layer, and the light-shielding metal layer.

7. The display panel according to claim 6, wherein:
   the gate metal layer is disposed on a side of the base substrate,
   the capacitor metal layer is disposed on a side of the gate metal layer away from the base substrate,
   the source/drain metal layer is disposed on a side of the capacitor metal layer away from the base substrate, and
   the light-shielding metal layer is disposed between the base substrate and the gate metal layer.

8. The display panel according to claim 7, wherein:
   the at least one inorganic layer is disposed between the gate metal layer and the source/drain metal layer, and
   the raised portion is disposed in a same layer of the gate metal layer.

9. The display panel according to claim 7, wherein:
   the at least one inorganic layer is disposed between the capacitor metal layer and the source/drain metal layer, and
   the raised portion is disposed in a same layer of the capacitor metal layer.

10. The display panel according to claim 8, wherein:
the raised portion is electrically connected to the source/drain metal layer through a first via.

11. The display panel according to claim 7, wherein:
the at least one inorganic layer includes a first inorganic layer and a second inorganic layer, wherein the first inorganic layer is disposed between the gate metal layer and the capacitor metal layer, and the second inorganic layer is disposed between the capacitor metal layer and the source/drain metal layer; and
the raised portion includes a first raised portion and a second raised portion that are disposed in different film layers, wherein the first raised portion is disposed in a same layer of one of the gate metal layer and the capacitor metal layer, and the second raised portion is disposed in a same layer of the other of the gate metal layer and the capacitor metal layer.

12. The display panel according to claim 11, wherein:
the display function layer includes an anode layer, an organic light-emitting layer, and a cathode layer that are sequentially stacked in a direction perpendicular to a surface of the display panel; and
one or more of the first raised portion and the second raised portion are electrically connected to the cathode layer through a second via.

13. The display panel according to claim 7, wherein:
the at least one inorganic layer is disposed between the light-shielding metal layer and the gate metal layer, and
the raised portion is disposed in a same layer of the light-shielding metal layer.

14. The display panel according to claim 7, wherein:
the at least one inorganic layer includes a third inorganic layer and a fourth inorganic layer, wherein the third inorganic layer is disposed between the light-shielding metal layer and the gate metal layer, and the fourth inorganic layer is disposed between the gate metal layer and the capacitor metal layer; and
the raised portion includes a third raised portion and a fourth raised portion that are disposed in different film layers, wherein the third raised portion is disposed in a same layer of one of the gate metal layer and the light-shielding metal layer, and the fourth raised portion is disposed in a same layer of the other of the gate metal layer and the light-shielding metal layer.

15. The display panel according to claim 2, wherein:
the raised portion includes a plurality of groups of raised portions sequentially disposed in a direction away from the irregularly-shaped edge, and each group of raised portions includes a fifth raised portion, a sixth raised portion, and a seventh raised portion;
in a direction perpendicular to a surface of the display panel, the fifth raised portion is disposed between the sixth raised portion and the seventh raised portion; and
one of adjacent fifth raised portions is electrically connected to one sixth raised portion through a fourth via, and the other of the adjacent fifth raised portions is electrically connected to one seventh raised portion through a fifth via.

16. The display panel according to claim 2, wherein:
a shape of each of the protruded portion and the raised portion is one of a strip structure and an island structure.

17. The display panel according to claim 1, wherein:
in the first direction, a length of the protruded portion is greater than a length of the irregularly-shaped edge.

18. The display panel according to claim 17, wherein:
in the first direction, an end of the first projection is a first end, and an end of the irregularly-shaped edge is a second end, wherein the first end and the second end are located on a same side of the notch, and a distance between the first end and the second end is in a range of approximately 5 µm-200 µm.

19. The display panel according to claim 1, further including:
an auxiliary blocking part, formed in the non-display region, wherein:
the auxiliary blocking part is disposed around the display region and around the display function layer,
the auxiliary blocking part is disposed on a side of the blocking part adjacent to the display region, and
a projection of the auxiliary blocking part on the base substrate at least partially overlaps the first projection.

20. A display device, comprising the display panel according to claim 1.

* * * * *